United States Patent [19]

Thuries et al.

[11] Patent Number: 5,438,256

[45] Date of Patent: Aug. 1, 1995

[54] APPARATUS AND METHOD FOR MEASUREMENT FROM THE GROUND FOR HIGH VOLTAGE OVERHEAD LINES

[75] Inventors: Edmond Thuries, Meyzieu; Michel Collet, Villeurbanne, both of France

[73] Assignee: GEC Alsthom T & D SA, Paris, France

[21] Appl. No.: 86,393

[22] Filed: Jul. 6, 1993

[30] Foreign Application Priority Data

Jul. 6, 1992 [FR]  France ................................ 92 08311

[51] Int. Cl.$^6$ ............................................. G01R 33/00
[52] U.S. Cl. ............................ 324/117 R; 324/117 H; 324/127
[58] Field of Search ................. 324/127, 117 R, 117 H

[56] References Cited

U.S. PATENT DOCUMENTS

| | | | |
|---|---|---|---|
| 3,312,898 | 4/1967 | Browne | 324/117 R |
| 3,418,575 | 12/1968 | Spindle | 324/117 R |
| 4,539,520 | 9/1985 | McBride | 324/117 H |
| 4,799,005 | 1/1989 | Fernandes | 324/127 |
| 4,801,937 | 1/1989 | Fernandes | 324/127 |
| 5,146,156 | 9/1992 | Marcel | 324/117 H |

FOREIGN PATENT DOCUMENTS 0354079 2/1990 European Pat. Off. .
2062251 5/1981 United Kingdom .

OTHER PUBLICATIONS

M. Nakagawa "Ground Return Effects in Current Measurement of Overhead Lines" IEEE 1979 Power Engineering Society Winter Meeting.
K. H. Yearby "Power Line Harmonic Radiation in New Foundland" Journal of Atmospheric and Terrestrial Physics vol. 45 No. 6 1983.
William A. Hoppel "Bipolar Model of Electrical Environment of the Hi Voltage Direct Current Power Line" Journal of Geophysical Research vol. 90 D4 Jun. 30 1985.

Primary Examiner—Kenneth A. Wieder
Assistant Examiner—Mark Wardas
Attorney, Agent, or Firm—Sughrue, Mion, Zinn, Macpeak & Seas

[57] ABSTRACT

The present invention relates to an apparatus and a method for measuring the current in a high voltage overhead line (A). The apparatus comprises at least one device (2) for detecting and measuring the magnetic field induced by the line (A), the detector being arranged on the ground adjacent the line (A), the current being deduced by calculation.

4 Claims, 1 Drawing Sheet

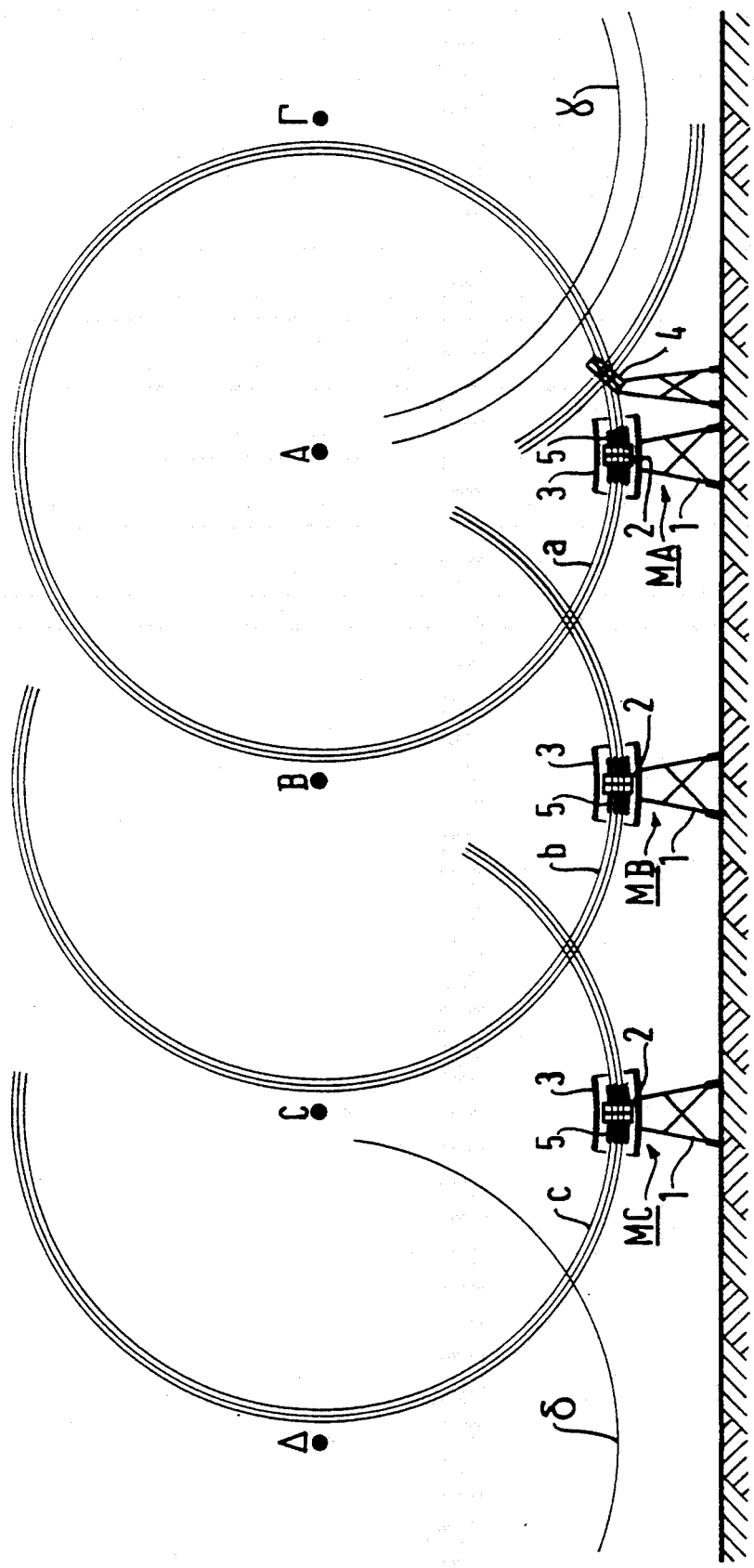

APPARATUS AND METHOD FOR MEASUREMENT FROM THE GROUND FOR HIGH VOLTAGE OVERHEAD LINES

The present invention relates to apparatus for measuring the current in overhead electrical lines from the ground, as well as to a method of measurement using such apparatus.

The measurement of current in high voltage overhead lines requires access to the cables and therefore manipulation operations at height with a special machine or equipment. With the invention, current can be measured from ground level.

To do this, the apparatus according to the invention comprises, for each line, at least one device for detecting and measuring the magnetic field induced by the line, the detector being disposed on the ground in proximity to the line, and current being deduced by calculation.

With this measuring apparatus, there is no need for any direct intervention on the line nor any interruption in its operation for installation or maintenance. Moreover, it is independent of existing measuring or protection equipment, which allows circuit-breakers to be controlled independently.

In a preferred embodiment, the device is arranged at right angles to the line.

Advantageously, the device is housed in a curved tube of magnetic material, the axis of which is substantially an arc of a circle centred on the line.

The device may be a magnetometer of any type and in particular a winding, the axis of which is perpendicular to the corresponding line.

To improve the efficiency of the winding, a magnetic sector made up of laminations may be placed inside the winding.

Preferably, the laminations conform to the curvature of the magnetic field lines, so as to act favorably on the concentric magnetic field due to the line and unfavorably on the magnetic fields arising from other parasitic sources.

According to another embodiment, the magnetometer may be a Hall effect sensor situated in a gap formed in a laminated magnetic sector.

The invention also relates to a method of measuring current for a group of n high voltage lines according to which method p detection and measurement devices are used, p being greater than or equal to n.

In a preferred embodiment, steady state current is calculated using the formula:

$$Em_i = A_{ij} I_j$$

where:

$Em_i$ is the electromotive force measured in device No.i, i lying in the range 1 to p, $I_j$ is the current intensity in line No. j, j lying in the range 1 to n, and $A_{ij}$ is the matrix of proportionality coefficients $a_{ij}$ relating electromotive force to current.

In the case of a group of n three-phase lines, an abnormal perturbation is corrected by calculation using the supplementary relationships:

$$I_i + I_{i+1} + I_{i+2} = 0$$

$$i = 3k - 2,$$

k lying in the range 1 to n/3.

Clearly, a group of magnetic field detection and measurement devices arranged at different heights above the ground will enable ground currents to be determined, their measurements being processed to take account of perturbations due to these currents in the measurements from the measuring apparatus.

Advantageously, under transient conditions, calculation of the instantaneous current $i_d(t)$ in line No.d is performed using the formula:

$$i_d(t) = \text{sum of real parts of } Id(f_k)\exp(2\pi f_k t j)$$

where:

t represents time, j is the imaginary number whose square equals −1, $f_k$ is the k-th harmonic of 10 Hz, $I_d(f_k)$ is the complex alternating component at frequency $f_k$ of the instantaneous current in line No.d, and d lies in the range 1 to n.

Preferably, in this last case, the voltage is filtered at the terminals of each device, the method described previously being applied for each of the non-zero harmonic frequencies $f_k$ so as to obtain the relationships linking the complex components of the current $I_d(fk)$ to the complex components of the electromotive voltage, the sum of the harmonic currents being calculated so as to obtain the instantaneous current $i_d(t)$.

The invention is described in more detail below with the aid of a drawing which shows just one preferred embodiment of the invention.

The Figure shows an apparatus in accordance with the invention.

Three high voltage overhead lines A, B, C of a balanced three-phase sub-set are arranged close to other overhead lines Γ, Δ forming an unbalanced sub-set.

Arranged on the ground in proximity to and preferably at right-angles to each line A, B, C in which the current is to be measured, there is at least one framework 1 supporting a device 2 for detecting and measuring the magnetic field induced by the lines A, B, C, the current intensity being deduced by calculation. Three magnetometer sensors $M_A$, $M_B$, $M_C$ are shown in the Figure.

Device 2 is housed in a curved tube 3 of magnetic material, the axis of which is substantially an arc of a circle centered on the line A, B, C. The device is a winding whose axis is arranged perpendicularly to the corresponding line. A laminated magnetic sector 5 is placed inside the winding 2.

Thus, the concentric lines a, b, c of the induced magnetic field pass through this device allowing measurement to take place. The tube 3 prevents interference from the parasitic magnetic field in the vicinity of the device 2.

Adjacent the three lines A, B, C may be other overhead lines Γ, Δ the lines of whose induced magnetic fields γ, δ interfere parasitically with the lines a, b. The correction required by this interaction may be made by calculation as shown later, and/or by corrective action on these fields.

In the latter case, at least one second device 4 for detecting and measuring a "correction" magnetic field is required, this device being of the same type as and arranged close to the first devices 2, this second device 4 being situated so as to measure the parasitic field induced by the adjacent line or lines γ, δ which do not form part of the sub-set.

The method of current measurement according to the invention will now be described.

For a set of n high voltage lines, p devices 2 are used, i.e. are arranged on the ground in proximity to the overhead lines, p being greater than or equal to n.

The current flowing in an overhead line gives rise to a magnetic flux and the variation in this magnetic flux, of alternating form, generates an electromotive force which is detected by the devices 2 and which is proportional to the current to be measured, provided precautions have been taken to use only materials having linear characteristics.

Under steady conditions, for each of the p devices, the currents in all n lines combine to create the magnetic flux, but in different ways. In each device 2, the variation of these magnetic fluxes causes an electromotive force $Em_k$ proportional to the currents $I_j$ to be measured. As the phase differences between the currents $I_j$ are significant, it is essential to consider the complex representation of the current which comprises a real part and an imaginary part, or a modulus and an argument.

The formula used is therefore:

$$Em_i = A_{ij} I_j$$

where:
$Em_i$ is the electromotive force measured in device No.i, i lying in the range 1 to p,
$I_j$ is the current in line No.j, j lying in the range 1 to n, and
$A_{ij}$ is the matrix of proportionality coefficients $a_{ij}$ relating electromotive force to current.

The coefficients $a_{ij}$ may be determined by calculation or measurement, by passing test currents of known magnitude.

The expression for $Em_k$ as a function of current is given by a linear system of p equations in n unknowns, the coefficients of which depend on the geometrical dimensions:

$$Em_1 = a_{11}I_1 + a_{12}I_2 + \ldots + a_{1n}I_n$$
$$Em_2 = a_{21}I_1 + a_{22}I_2 + \ldots + a_{2n}I_n$$
$$\vdots$$
$$Em_p = a_{p1}I_n + a_{p2}I_2 + \ldots + a_{pn}I_n$$

If p is always greater than n, this system of equations can be solved using regression methods, which make use of redundant information and which make the calculation of $I_n$ less dependent on any device 2 that may be defective or have a local fault. Detection of a faulty device can then give rise to a message at a control center which conveys the information to the maintenance operations department. Such regression methods are described for example in the work: "Mathematica, a system for doing mathematics by computer" by S. Wolfram, Addison-Wesley Publishing Company.

If p is equal to n, this system of equations can be solved with a unique solution. If this is not the case, that means the devices 2 are very badly placed.

The matrix $A_{ij}$ is therefore invertible and if the inverse matrix is designated as $B_{pq}$, the following system of n linear equations is obtained:

$$I_1 = b_{11}Em_1 + b_{12}Em_2 + \ldots + b_{1n}Em_n$$
$$I_2 = b_{21}Em_1 + b_{22}Em_2 + \ldots + b_{2n}Em_n$$
$$\vdots$$
$$I_n = b_{n1}Em_1 + b_{n2}Em_2 + \ldots + b_{nn}Em_n$$

Moreover, on three-phase lines, the equilibrium condition of the currents in normal operation can be expressed by:

$$I_i + I_{i+1} + I_{i+2} = 0$$

$$i = 3k - 2,$$

k lying in the range 1 to n/3.

or
$$I_1 + I_2 + I_3 = 0$$
$$I_4 + I_5 + I_6 = 0$$
$$\vdots$$
$$I_{n-2} + I_{n-1} + I_n = 0$$

If these conditions are satisfied, then good utilization of the lines is ensured.

However, if the installation is such that it is certain that these conditions are always satisfied, then the following supplementary relationships can be used to detect any possible transient modification of the coefficients $a_{ij}$.

The following can be obtained:

$$(b_{11} + b_{21} + b_{31})Em_1 + (b_{12} + b_{22} + b_{32})Em_2 + \ldots +$$
$$(b_{1n} + b_{2n} + b_{3n})Em_n = 0$$
$$(b_{41} + b_{51} + b_{61})Em_1 + (b_{42} + b_{52} + b_{62})Em_2 + \ldots +$$
$$(b_{4n} + b_{5n} + b_{6n})Em_n = 0$$
$$\vdots$$

By making use of these supplementary relationships, it is possible to correct for an abnormal perturbation localized at one device.

Close to or inside high voltage stations, electric currents may circulate in numerous cables, lines and earthing networks. When measuring electric currents in a high voltage overhead line from a distance, it is therefore necessary to make arrangements to reduce the influence of these parasitic currents to an acceptable level. To do this, a group of magnetic field detection and measurement devices arranged on the ground at different heights allow the ground currents to be determined, their measured values being processed to take account of the disturbances caused by these currents in the measurements of the devices 2 of the measuring apparatus.

It is therefore possible to identify the decrease in the magnetic fields as a function of distance. The electric currents in the lines give rise to magnetic fields proportional to 1/r, where r is the distance between the line and the detecting device. The electric currents in the ground or on the surface which circulate in a homogeneous flat configuration in one or more layers give rise to a constant magnetic field above the ground which is independent of height above the ground. The electric currents in the ground which may be similar to wirebourne currents give rise to magnetic fields as a function of 1/r.

The values and the complexity of the electrical currents in the ground, and the precision required from the measurements may necessitate a relatively large number of detecting devices. These devices arranged at different levels allow the ground currents to be determined in a manner which is sufficient to allow for their effects and therefore to improve the measurements of the currents in the overhead lines. This arrangement may also be extended by using several planes of devices, so as to work in all three dimensions.

Under transient conditions, the preceding formulae must be generalized.

For a time window [$t_1$, $t_2$], such as for example $t_2-t_1$ equal to 100 ms, the instantaneous current $i_d(t)$ in line No.d is calculated by the formula:

$$i_d(t) = \text{sum of } i_d(f_k, t)$$
$$= \text{sum of the real parts of } I_d(f_k)\exp(2\pi f_k tj)$$

where:
t represents time,
j is the imaginary number whose square is equal to $-1$,
$f_k$ is the k-th harmonic frequency of 10 Hz,
$I_d(f_k)$ is the complex alternating component at frequency $f_k$ of the instantaneous current in line No.d,
$i_d(f_k, t)$ is the alternating component at frequency $f_k$ of the instantaneous current $i_d(t)$,
d lying in the range 1 to n.
Similarly:

$$em_c(t) = \text{sum of } Em_c(f_k, t)$$
$$= \text{sum of the real parts of } Em_c(f_k)\exp(2\pi f_k tj)$$

where $em_c(t)$ is the instantaneous electromotive force at the terminals of device 2, and the instantaneous and complex values of the alternating component at frequency $f_k$ of the electromotive force $em_c(t)$ are written respectively $Em_c(f_k, t)$ and and $Em_c(f_k)$.

To do this, the voltage is filtered at the output of each device 2 by analog and/or digital means, and it is therefore possible to determine the modulus and phase of all $Em_c(f_k)$. In practice, for simple protection applications, only the first few harmonics will be of interest, up to frequencies of the order of 500 Hz. The preceding formulae are then applied separately, for each of the non-zero harmonics, to obtain the relationships which give $I_d(f_k)$ as a function of $Em_c(f_k)$. By summing these harmonic currents, the instantaneous current $i_d(t)$ is obtained, ignoring the direct component.

It should be noted that if devices 2 are used which give a measurement which is directly proportional to the magnetic field and independent of the frequency of this alternating field, it is then not necessary to separate out the harmonic frequencies and to perform a calculation with the complex components. The preceding formulae are then directly applicable to the instantaneous values and to digital processing in real values. This is the case if Hall effect sensors or superconductive systems are used. However, it is then necessary to allow for the local terrestrial magnetic field which can distort the value of the direct component.

We claim:
1. An apparatus for measuring current in a plurality of high voltage overhead electrical lines which form a group of n high voltage electrical lines above ground level, said apparatus comprising:

detecting means including a plurality p of devices (2) for detecting and measuring magnetic fields induced in the lines, said devices being at the ground level and in proximity to corresponding ones of said lines, wherein p is greater than n;

wherein the current is calculated by matrix calculation;

wherein a voltage is filtered at terminals of each of said devices (2);

wherein a formula, $Em_i = A_{ij}I_j$, where
$Em_i$ is the electromotive force measured in device N°i, i lying in the range of 1 to p,
$I_j$ is the current in line No. j, j lying in the range 1 to n, and
$A_{ij}$ is a matrix of proportionality coefficients $a_{ij}$ relating the electromotive force to a current intensity, is applied for each of a plurality of non-zero harmonic frequencies $f_k$ so as to obtain the relationships linking complex components of the current $I_d(f_k)$ to the complex components of the electromotive voltage, the sum of harmonic currents being calculated so as to obtain an instantaneous current $i_d(t)$; and wherein the calculation of the instantaneous current $i_d(t)$ in line No. d is performed according the formula, $i_d(t) = \text{sum of real parts of } Id(f_k)\exp(2\pi f_k tj)$, where
t represents time,
j is the imaginary number whose square equals $-1$,
$f_k$ is the k-th harmonic of 10 Hz,
$I_d(f_k)$ is the complex alternating component at frequency $f_k$ of the instantaneous current in line No. d, and
d lies in the range 1 to n.

2. The apparatus according to claim 1, wherein an abnormal perturbation is corrected by calculation, using the supplementary relationships:

$$I_i + I_{i+1} + I_{i+2} = 0$$
$$i = 3k - 2,$$

k lying in the range 1 to n/3.

3. The apparatus according to claim 2, wherein a group of magnetic field detection and measurement devices arranged at different heights above ground enable the ground currents to be determined, their measurements being processed to take account of the perturbations due to the ground currents in the measurements from devices (2) of the measurement apparatus.

4. The apparatus according to claim 1, characterized in that a group of magnetic field detection and measurement devices arranged at different heights above the ground enable the ground currents to be determined, their measurements being processed to take account of the perturbations due to these currents in the measurements from the devices (2) of the measuring apparatus.

* * * * *